(12) United States Patent
Yamauchi et al.

(10) Patent No.: US 8,853,546 B2
(45) Date of Patent: Oct. 7, 2014

(54) PRINTED CIRCUIT BOARD AND METHOD OF MANUFACTURING THE SAME

(75) Inventors: Daisuke Yamauchi, Ibaraki (JP); Tetsuya Oosawa, Ibaraki (JP); Mitsuru Honjo, Ibaraki (JP); Masami Inoue, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 455 days.

(21) Appl. No.: 12/837,543

(22) Filed: Jul. 16, 2010

(65) Prior Publication Data

US 2011/0011626 A1 Jan. 20, 2011

(30) Foreign Application Priority Data

Jul. 17, 2009 (JP) .................................. 2009-169328
Jul. 22, 2009 (JP) .................................. 2009-170960

(51) Int. Cl.
| | |
|---|---|
| H05K 1/00 | (2006.01) |
| H05K 3/36 | (2006.01) |
| H05K 3/24 | (2006.01) |
| H05K 1/05 | (2006.01) |
| H05K 3/00 | (2006.01) |
| H05K 3/28 | (2006.01) |

(52) U.S. Cl.
CPC ............... *H05K 3/242* (2013.01); *H05K 1/056* (2013.01); *H05K 3/002* (2013.01); *H05K 3/0052* (2013.01); *H05K 3/28* (2013.01); *H05K 2201/0187* (2013.01); *H05K 2201/0191* (2013.01)
USPC ........... 174/251; 174/250; 174/255; 174/256; 174/257; 174/258; 29/829; 29/830

(58) Field of Classification Search
USPC ......... 174/250, 251, 255, 256–258, 261, 265; 29/830, 829, 738; 361/748, 749–751, 361/761
See application file for complete search history.

(56) References Cited

U.S. PATENT DOCUMENTS 4,289,575 A * 9/1981 Matsumoto et al. ............ 216/13
5,808,521 A 9/1998 Tosaka
(Continued)

FOREIGN PATENT DOCUMENTS

| CN | 101160020 A | 4/2008 |
|---|---|---|
| JP | 02-164098 A | 6/1990 |

(Continued)

OTHER PUBLICATIONS

Y. Miyazaki et al., "Wireless Suspensions for HDDs with GMR: GTRiM Series", FUJISU. 53, 2, pp. 145-149, (2002) with English Abstract.

(Continued)

*Primary Examiner* — Anatoly Vortman
(74) *Attorney, Agent, or Firm* — Panitch Schwarze Belisario & Nadel LLP

(57) ABSTRACT

A base insulating layer is formed on a suspension body. A lead wire for plating and a wiring trace are integrally formed on the base insulating layer. A cover insulating layer is formed on the base insulating layer to cover the lead wire for plating and the wiring trace. A thickness of a portion of the cover insulating layer above a region of the base insulating layer in which the lead wire for plating is formed is set smaller than the thickness of a portion of the cover insulating layer above other regions of the base insulating layer.

10 Claims, 9 Drawing Sheets

(56) References Cited

U.S. PATENT DOCUMENTS

| | | |
|---|---|---|
| 2002/0100609 A1 | 8/2002 | Ookawa et al. |
| 2004/0070884 A1 | 4/2004 | Someya et al. |
| 2006/0223223 A1 | 10/2006 | Okazawa et al. |
| 2008/0084530 A1* | 4/2008 | Hirabayashi et al. .......... 349/150 |
| 2011/0048791 A1* | 3/2011 | Ohsawa et al. ............... 174/267 |

FOREIGN PATENT DOCUMENTS

| | | |
|---|---|---|
| JP | H06-334410 A | 12/1994 |
| JP | H09-51207 A | 2/1997 |
| JP | 09-214076 A | 8/1997 |
| JP | 09-246729 A | 9/1997 |
| JP | 2000-269379 A | 9/2000 |
| JP | 2001-110927 A | 4/2001 |
| JP | 2002222578 A | 8/2002 |
| JP | 2002-344120 A | 11/2002 |
| JP | 2002-368431 A | 12/2002 |
| JP | 2003-124633 A | 4/2003 |
| JP | 2003-168864 A | 6/2003 |
| JP | 2003-198215 A | 7/2003 |
| JP | 2003-273611 A | 9/2003 |
| JP | 2005-175078 A | 6/2005 |
| JP | 2006-287034 A | 10/2006 |
| JP | 2008-028233 A | 2/2008 |

OTHER PUBLICATIONS

Office Action issued Dec. 11, 2012 in JP Application No. 2009-170960.

Office Action issued Nov. 5, 2013 in CN Application No. 201010232846.X.

Office Action issued Jul. 15, 2014 in CN Application No. 201010232846.X.

* cited by examiner

F I G. 6
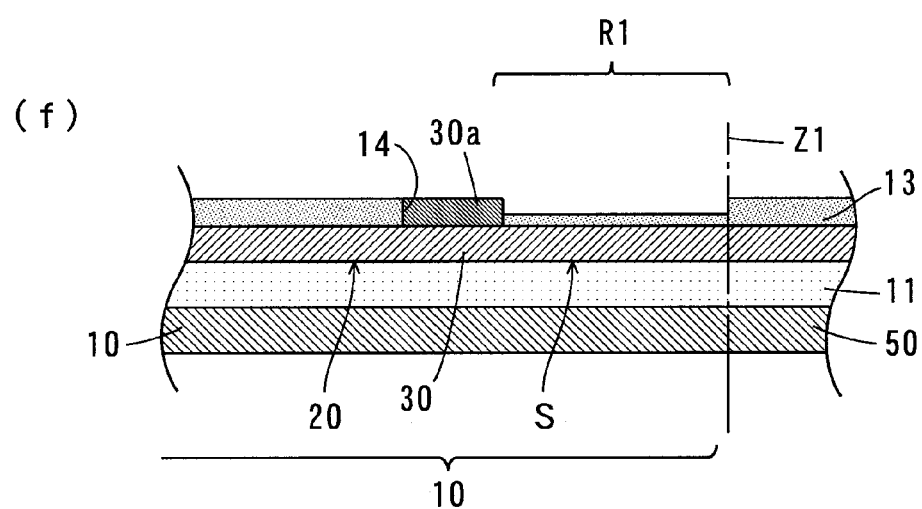

F I G. 9
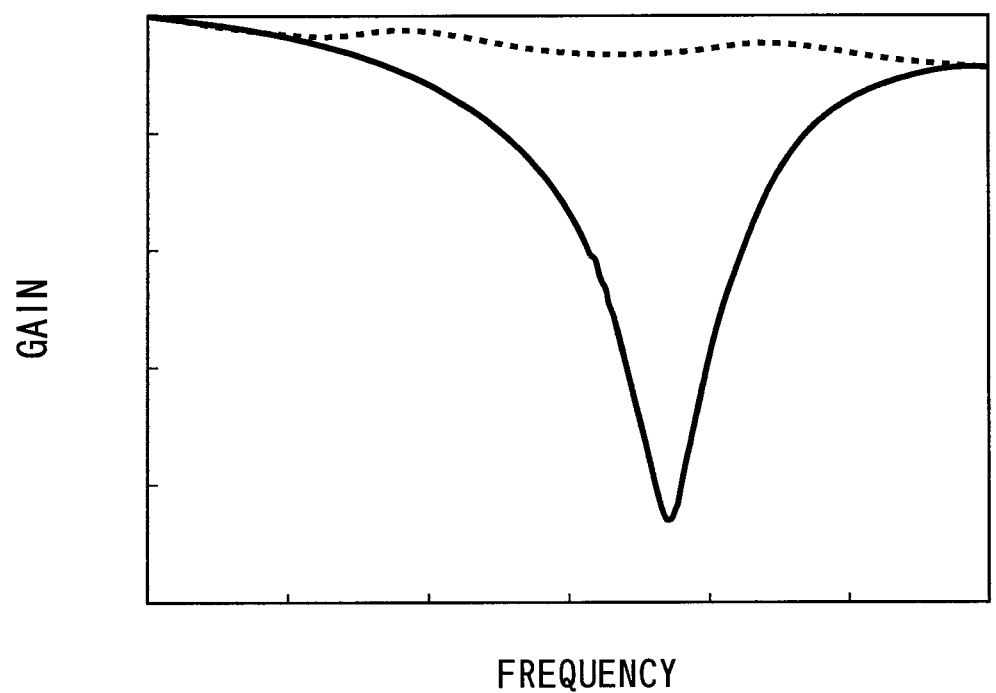

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

Conductor traces are formed as wiring traces on a substrate by a subtractive method or the like in manufacture of a printed circuit board. Portions of the conductor traces are subjected to electrolytic plating, so that connection terminals are formed. Power feeding to the conductor traces is required for the electrolytic plating. Therefore, wiring portions for power feeding (hereinafter referred to as lead wires for plating) that extend from the portions at which the connection terminals are to be formed to one end of the substrate are formed during formation of the conductor traces. Power is fed to the conductor traces through the lead wires for plating.

According to JP 2006-287034 A, for example, in manufacture of a printed circuit board that is called a BGA (Ball Grid Array) used in a semiconductor device, upper surfaces of bonding pads of the conductor traces formed by the subtractive method are subjected to electrolytic nickel plating and electrolytic gold plating, so that the connection terminals are formed.

The lead wires for plating that extend from the bonding pads on the substrate to the one end of the substrate are electrically connected to an external electrode for plating, so that the power feeding is carried out. Accordingly, the upper surfaces of the bonding pads are subjected to the electrolytic nickel plating, and subsequently subjected to the electrolytic gold plating.

In the foregoing method, however, the lead wires for plating, which are unnecessary after the electrolytic plating, remain on the printed circuit board. When an electrical signal is transmitted through the conductor traces while another electronic circuit is connected to the connection terminals of the printed circuit board, the lead wires for plating become stubs branched from transmission lines. Resonance occurs at a particular frequency in such stubs. This causes a particular frequency component of the electrical signal to be attenuated. This may result in disadvantages such as a blunt waveform of the electrical signal.

Removing the lead wires for plating after the electrolytic plating is considered since the lead wires for plating are not necessary after the electrolytic plating. However, a process of removing the lead wires for plating is additionally required, thus leading to an increase in manufacturing cost.

BRIEF SUMMARY OF THE INVENTION

An object of the present invention is to provide a printed circuit board in which effects of a lead for plating exerted on a waveform of an electrical signal is reduced and a method of manufacturing the same.

(1) According to an aspect of the present invention, a printed circuit board includes a first insulating layer, a wiring trace formed on the first insulting layer, a terminal provided at a portion of the wiring trace, a lead for plating formed on the first insulating layer to extend from the wiring trace, and a second insulating layer formed on the first insulting layer to cover the wiring trace excluding the terminal and cover the lead for plating, wherein an effective dielectric constant of a region overlapping the lead for plating is set smaller than an effective dielectric constant of a region overlapping the wiring trace.

In the printed circuit board, the wiring trace, the terminal provided at the portion of the wiring trace, and the lead for plating that extends from the wiring trace are formed on the first insulating layer. The second insulting layer is formed on the first insulating layer to cover the wiring trace excluding the terminal and cover the lead for plating. The effective dielectric constant of the region overlapping the lead for plating is set smaller than the effective dielectric constant of the region overlapping the wiring trace.

A resonance frequency in the lead for plating is increased when an electrical signal is transmitted through the wiring trace in this state, thus increasing a frequency of a signal component attenuated by resonance. This allows reduced effects of attenuation of the signal component caused by the resonance in the lead for plating to be exerted on a waveform of the electrical signal. As a result, waveform distortion of the electrical signal can be reduced without removing the lead for plating.

(2) A thickness of at least one of a portion of the first insulating layer overlapping the lead for plating and a portion of the second insulating layer overlapping the lead for plating may be set smaller than a thickness of at least one of a portion of the first insulating layer overlapping the wiring trace and a portion of the second insulating layer overlapping the wiring trace.

In this case, the thickness of an air space can be increased in the region of constant thickness overlapping the lead for plating. The dielectric constant of air (atmosphere) is smaller than the dielectric constant of each of the first and second insulating layers, so that the effective dielectric constant of the region overlapping the lead for plating can be reduced. This allows the frequency of the signal component attenuated by the resonance to be increased without using an additional member with a small dielectric constant.

(3) An opening may be formed in at least one of a portion of the first insulating layer overlapping the lead for plating and a portion of the second insulating layer overlapping the lead for plating.

In this case, a space is formed in the region of constant thickness overlapping the lead for plating. The dielectric constant of air (atmosphere) is smaller than the dielectric constant of each of the first and second insulating layers, so that the effective dielectric constant of the region overlapping the lead for plating can be reduced. This allows the frequency of the signal component attenuated by the resonance to be increased without using an additional member with a small dielectric constant.

(4) A material having a lower dielectric constant than a dielectric constant of the first or second insulating layer may be filled in the opening.

In this case, the effective dielectric constant inside the opening can be smaller than the dielectric constant of each of the first and second insulating layers. This reduces the effective dielectric constant of the region overlapping the lead for plating without exposing the lead for plating. As a result, reliability of the printed circuit board can be ensured.

(5) At least one of the first and second insulating layers may be formed such that the lead for plating is exposed.

In this case, the region overlapping the lead for plating can be replaced with an air space. The dielectric constant of air (atmosphere) is smaller than the dielectric constant of each of the first and second insulating layers, thus sufficiently reducing the effective dielectric constant of the region overlapping the lead for plating. This allows the frequency of the signal component attenuated by the resonance to be sufficiently increased without using an additional member with a small dielectric constant.

(6) According to another aspect of the present invention, a method of manufacturing a printed circuit board includes the steps of forming a conductor pattern including a wiring trace, a terminal provided at a portion of the wiring trace, and a lead for plating extending from the wiring trace on a first insulating layer, forming a second insulating layer on the first insulating layer to cover the wiring trace excluding the terminal and cover the lead for plating, forming the terminal coated with a plating layer at the portion of the wiring trace by feeding power to the wiring trace through the lead for plating, and setting an effective dielectric constant of a region overlapping the lead for plating smaller than an effective dielectric constant of a region overlapping the wiring trace.

In method of the manufacturing the printed circuit board, the conductor pattern is formed on the first insulating layer. The conductor pattern includes the wiring trace, the terminal provided at the portion of the wiring trace, and the lead for plating that extends from the wiring trace. The second insulting layer is formed on the first insulating layer to cover the wiring trace excluding the terminal and cover the lead for plating. In this case, the effective dielectric constant of the region overlapping the lead for plating is set smaller than the effective dielectric constant of the region overlapping the wiring trace. Power is fed to the wiring trace through the lead for plating, so that the terminal coated with the plating layer is formed at the portion of the wiring trace.

In the printed circuit board manufactured in the foregoing manner, a resonance frequency in the lead for plating is increased when an electrical signal is transmitted through the wiring trace, thus increasing a frequency of a signal component attenuated by resonance. This allows reduced effects of attenuation of the signal component caused by the resonance to be exerted on a waveform of the electrical signal. As a result, waveform distortion of the electrical signal can be reduced without removing the lead for plating.

(7) The step of setting the effective dielectric constant smaller may include the step of setting a thickness of at least one of a portion of the first insulating layer overlapping the lead for plating and a portion of the second insulating layer overlapping the lead for plating smaller than a thickness of at least one of a portion of the first insulating layer overlapping the wiring trace and a portion of the second insulating layer overlapping the wiring trace.

In this case, the thickness of an air space can be increased in the region of constant thickness overlapping the lead for plating. The dielectric constant of air (atmosphere) is smaller than the dielectric constant of each of the first and second insulating layers, so that the effective dielectric constant of the region overlapping the lead for plating can be reduced. This allows the frequency of the signal component attenuated by the resonance to be increased without using an additional member with a small dielectric constant.

(8) The step of setting the effective dielectric constant smaller may include the step of forming an opening in at least one of a portion of the first insulating layer overlapping the lead for plating and a portion of the second insulating layer overlapping the lead for plating.

In this case, a space is formed in the region of constant thickness overlapping the lead for plating. The dielectric constant of air (atmosphere) is smaller than the dielectric constant of each of the first and second insulating layers, so that the effective dielectric constant of the region overlapping the lead for plating can be reduced. This allows the frequency of the signal component attenuated by the resonance to be increased without using an additional member with a small dielectric constant.

(9) The step of setting the effective dielectric constant smaller may further include the step of filling a material having a lower dielectric constant than a dielectric constant of the first or second insulating layer in the opening.

In this case, the effective dielectric constant inside the opening can be smaller than the dielectric constant of each of the first and second insulating layers. This reduces the effective dielectric constant of the region overlapping the lead for plating without exposing the lead for plating. As a result, reliability of the printed circuit board can be improved.

(10) The step of setting the effective dielectric constant smaller may include the step of forming at least one of the first and second insulating layers such that the lead for plating is exposed.

In this case, the region overlapping the lead for plating can be replaced with an air space. The dielectric constant of air (atmosphere) is smaller than the dielectric constant of each of the first and second insulating layers, thus reducing the effective dielectric constant of the region overlapping the lead for plating. This allows the frequency of the signal component attenuated by the resonance to be increased without using an additional member with a small dielectric constant.

According to the present invention, the resonance frequency in the lead for plating is increased, thus increasing the frequency of the signal component attenuated by the resonance. This allows reduced effects of the signal component caused by the resonance in the lead for plating to be exerted on the waveform of the electrical signal.

Other features, elements, characteristics, and advantages of the present invention will become more apparent from the following description of preferred embodiments of the present invention with reference to the attached drawings.

BRIEF DESCRIPTION OF THE SEVERAL
VIEWS OF THE DRAWINGS

FIG. 6 is a schematic sectional view for illustrating a manufacturing step of the suspension board.

FIG. 9 is a diagram showing simulation results of calculation of losses in a differential mode input and a differential mode output (Sdd21) between wiring traces of the suspension board and wiring traces of the FPC board.

DETAILED DESCRIPTION OF THE INVENTION

Figure 1:
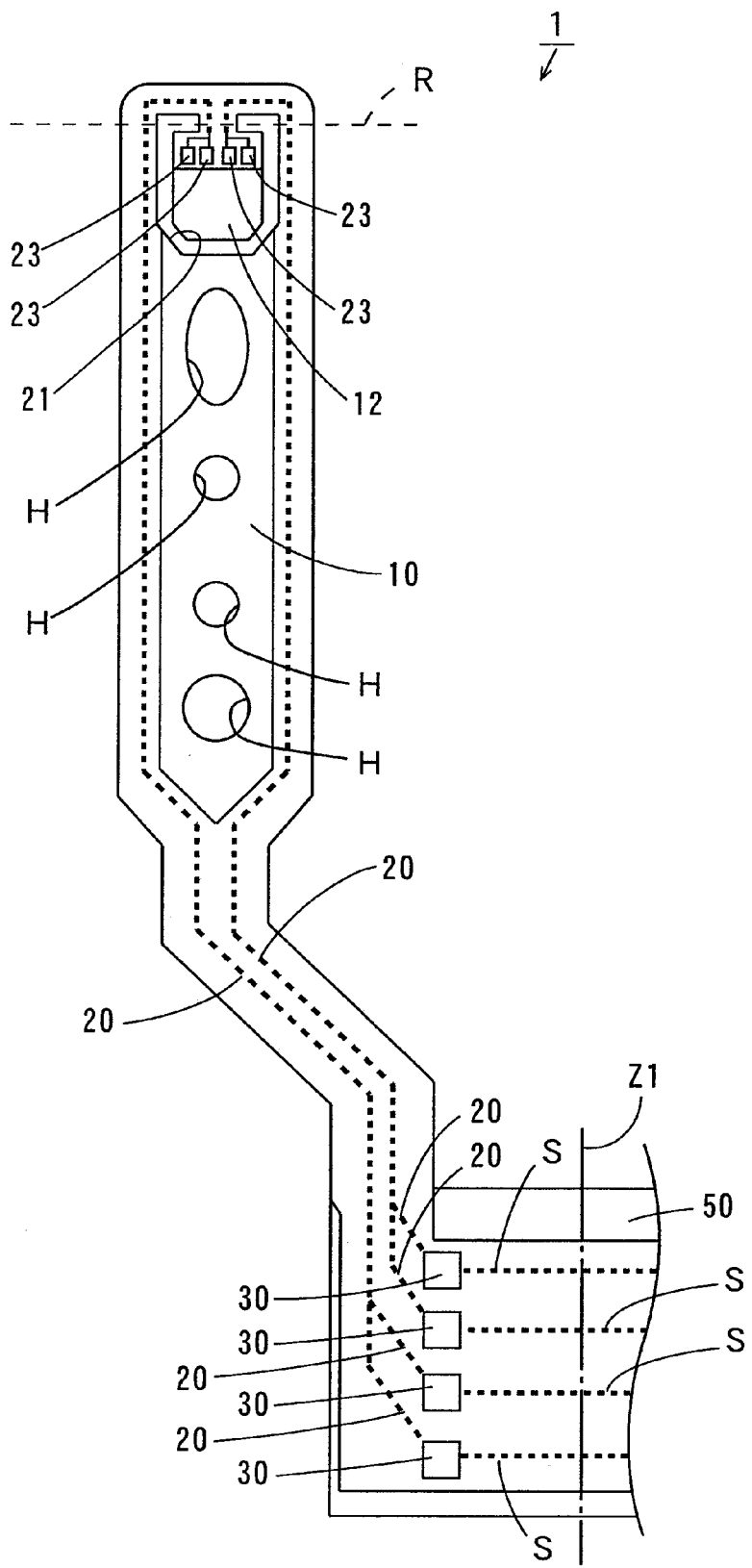
FIG. 1 is a top view of a suspension board.

Description will be made of a printed circuit board and a method of manufacturing the same according to embodiments of the present invention while referring to the drawings. In the embodiments below, a suspension board used for reading and writing in and from a hard disk is described as one example of the printed circuit board.

(1) First Embodiment (1-1) Configuration of the Suspension Board

FIG. 1 is a top view of the suspension board according to the embodiments of the present invention. As shown in FIG. 1, the suspension board 1 includes a suspension body 10 formed of a long-sized metal substrate. A plurality of holes H are formed in the suspension body 10. A plurality of wiring traces 20 are formed on the suspension body 10. Each wiring trace is provided with electrode pads 23, 30 at its one end and other end, respectively.

At the tip of the suspension body 10, a U-shaped opening 21 is formed, thereby providing a magnetic head supporting portion (hereinafter referred to as a tongue) 12. The tongue 12 is bent along the broken line R to form a given angle with respect to the suspension body 10. The plurality of electrode pads 23 are formed at an end of the tongue 12.

A magnetic head that performs reading and writing in and from the hard disk is mounted on the tongue 12. Terminals of the magnetic head are connected to the plurality of electrode pads 23, respectively.

The plurality of electrode pads 30 are formed at the other end of the suspension body 10. A plurality of lead wires S for plating are formed to extend from the plurality of electrode pads 30 toward the opposite side of the wiring traces 20.

In the manufacture, a plurality of suspension boards 1 are formed at the same time in a metal support substrate 50, and each suspension board 1 is then separated from other regions of the support substrate 50. In this case, the suspension body 10 is formed of part of the support substrate 50.

The plurality of lead wires S for plating of each suspension board 1 extend to a region on the support substrate 50 outside each suspension board 1 to be connected to power feed terminals. After each suspension board 1 is completed, each suspension body 10 is separated from the other regions of the support substrate 50 at the one-dot and dash line Z1.

Figure 2:
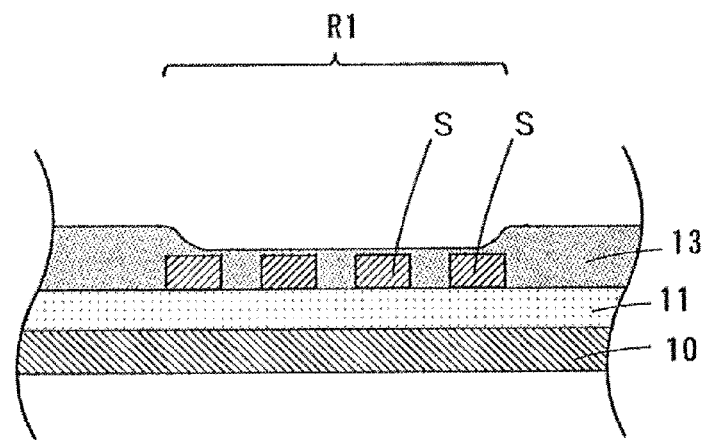
FIG. 2 is a schematic vertical sectional view of lead wires for plating and peripheral portions thereof.
Figure 3:
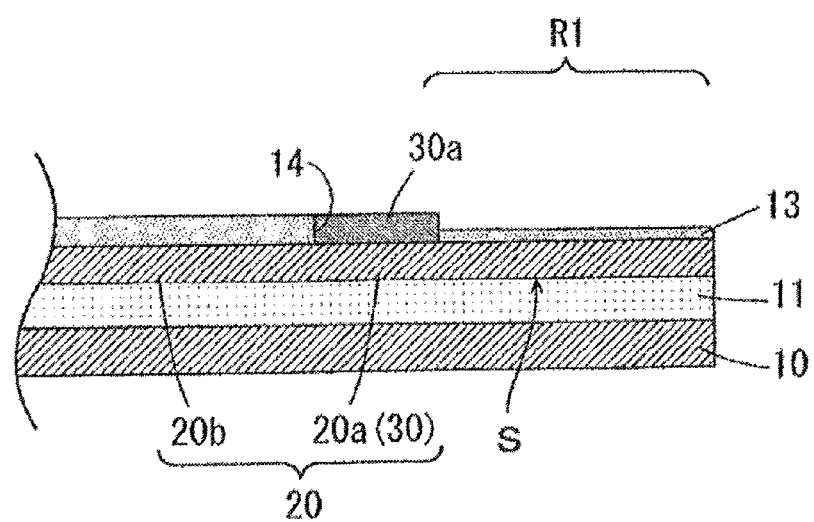
FIG. 3 is a schematic vertical sectional view of the lead wire for plating and the peripheral portions thereof.
Figure 2A:
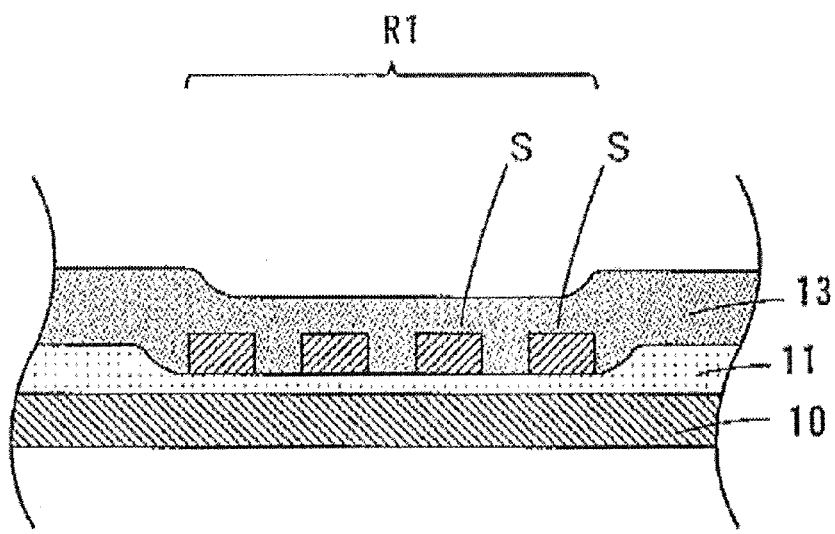
FIG. 2A is a schematic vertical sectional view of lead wires for plating and peripheral portions thereof, according to another embodiment of the invention.
Figure 3A:
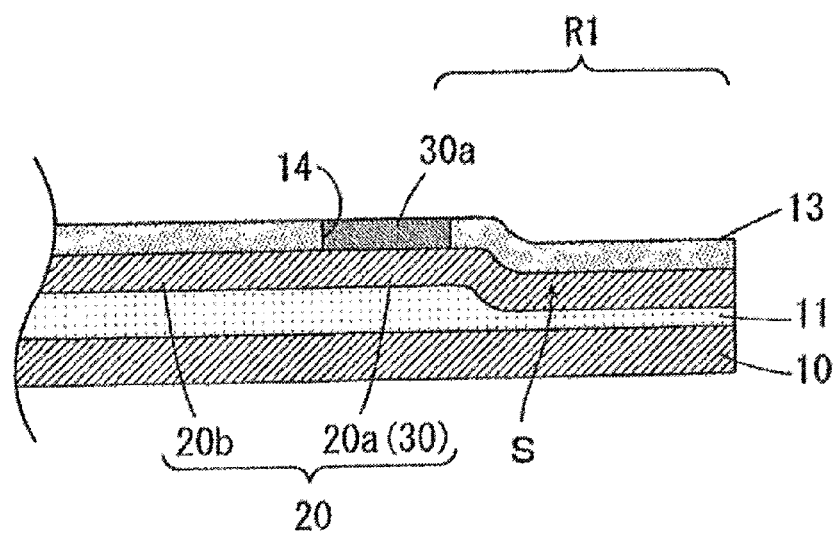
FIG. 3A is a schematic vertical sectional view of lead wires for plating and peripheral portions thereof, according to another embodiment of the invention.

FIGS. 2 and 3 are schematic vertical sectional views of the lead wires S for plating and peripheral portions thereof. FIG. 2 shows a cross section in a direction perpendicular to the lead wires S for plating, and FIG. 3 shows a cross section in a direction along the lead wires S for plating and the wiring trace 20.

As shown in FIGS. 2 and 3, a base insulating layer 11 made of polyimide, for example, is formed on the suspension body 10 made of stainless steel (SUS), for example.

The plurality of lead wires S for plating (the wiring traces 20) made of copper, for example, are formed at a given distance from one another on the base insulating layer 11. Each wiring trace 20 and each lead wire S for plating are integrally formed as shown in FIG. 3.

A cover insulating layer 13 made of polyimide, for example, is formed on the base insulating layer 11 to cover the plurality of lead wires S for plating and the plurality of wiring traces 20. The thickness of a portion of the cover insulating layer 13 above a region R1 of the base insulating layer 11 in which the plurality of lead wires S for plating are formed is set smaller than the thickness of portions of the cover insulating layer 13 above other regions of the base insulating layer 11.

As shown in FIG. 3, a hole 14 is formed in a portion of the cover insulating layer 13 above the electrode pad 30 of each wiring trace 20. The hole 14 reaches an upper surface of the electrode pad 30. A plating layer 30a made of gold, for example, is formed to fill each hole 14.

(1-2) Method of Manufacturing the Suspension Board

Description will be made of a method of manufacturing the suspension board 1 according to the first embodiment. Here, the steps of forming the tongue 12, the plurality of electrode pads 23 and the holes H of FIG. 1 are not described.

Figure 4:
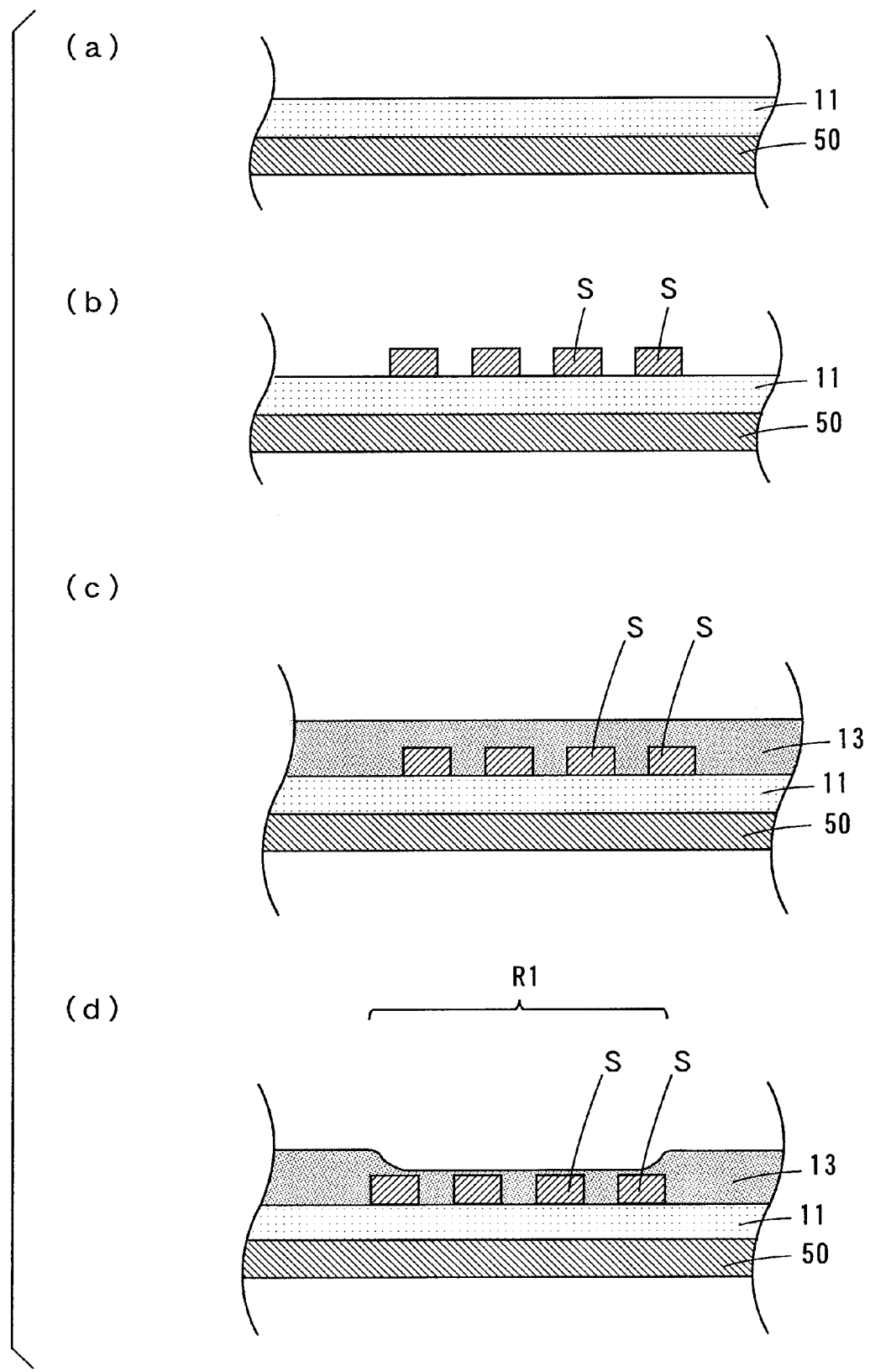
FIG. 4 is a schematic sectional view for illustrating manufacturing steps of the suspension board.
Figure 5:
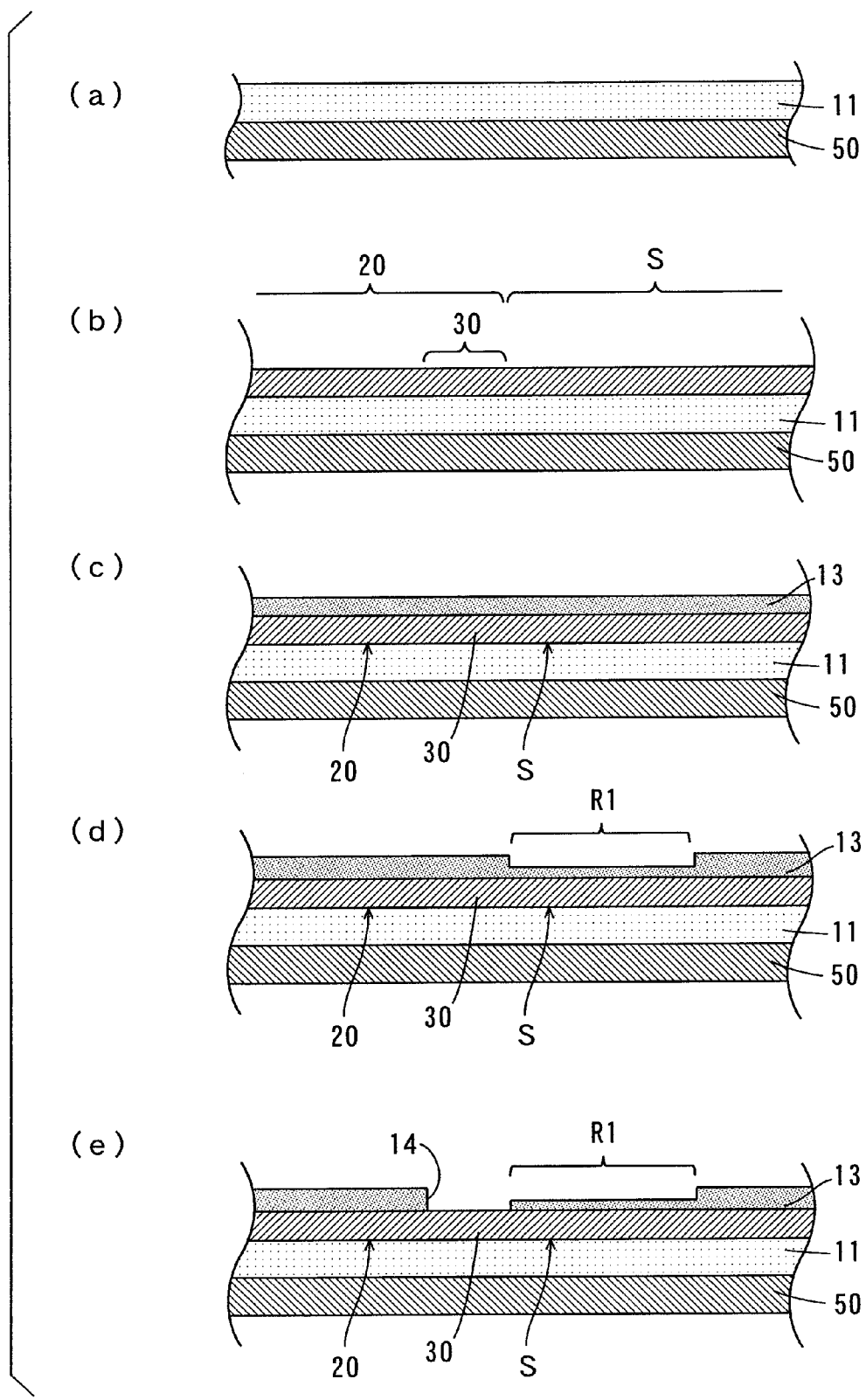
FIG. 5 is a schematic sectional view for illustrating manufacturing steps of the suspension board.

FIGS. 4 to 6 are schematic sectional views for illustrating the manufacturing steps of the suspension board 1 according to the embodiments of the present invention. FIG. 4 shows the manufacturing steps in the cross section at the same portion as that shown in FIG. 2, and FIGS. 5 and 6 show the manufacturing steps in the cross section at the same portion as that shown in FIG. 3.

First, the support substrate 50 made of stainless steel (SUS), for example, is prepared. The base insulating layer 11 made of polyimide, for example, is subsequently formed on the support substrate 50 as shown in (a) of FIGS. 4 and 5.

Another material such as aluminum instead of stainless steel may be used as the material for the support substrate 50. The thickness of the support substrate 50 is preferably not less than 5 μm and not more than 2000 μm, and more preferably not less than 10 μm and not more than 1000 μm.

Another insulating material such as epoxy instead of polyimide may be used as the material for the base insulating layer 11. The thickness of the base insulating layer 11 is preferably not less than 5 μm and not more than 2000 μm, and more preferably not less than 10 μm and not more than 1000 μm.

Next, the plurality of wiring traces 20 and the plurality of lead wires S for plating made of copper, for example, are formed on the base insulating layer 11 as shown in (b) of FIGS. 4 and 5. In this case, the electrode pad 30 is provided at the end of each wiring trace 20, and the lead wire S for plating is provided to extend from each electrode pad 30 toward the opposite side of the wiring trace 20.

The wiring traces 20 and the lead wires S for plating may be formed using a semi-additive method, for example, and may be formed using another method such as a subtractive method. Another metal such as gold and aluminum or an alloy such as a copper alloy and an aluminum alloy instead of copper may be used as the material for the wiring traces 20 and the lead wires S for plating.

The thickness of each of the wiring traces 20 and the lead wires S for plating is preferably not less than 4 μm and not more than 200 μm, for example, and more preferably not less than 10 μm and not more than 50 μm. The width of each of the wiring traces 20 and the lead wires S for plating is preferably not less than 10 μm and not more than 1000 μm, for example, and more preferably not less than 20 μm and not more than 200 μm.

The cover insulating layer 13 made of polyimide, for example, is then formed on the base insulting layer 11 to cover the plurality of wiring traces 20 and the plurality of lead wires S for plating as shown in (c) of FIGS. 4 and 5. Another material such as epoxy instead of polyimide may be used as the material for the cover insulating layer 13.

Next, an upper surface of the portion of the cover insulating layer 13 above the region R1 of the base insulating layer 11 in which the plurality of lead wires S for plating are formed is etched, so that the thickness of the portion of the cover insulating layer 13 above the region R1 of the base insulating layer 11 is made smaller than the thickness of the portion of the cover insulating layer 13 above the other regions of the base insulating layer 11 as shown in (d) of FIGS. 4 and 5.

The etching depth is preferably not more than 70%, more preferably not more than 50%, of the thickness of the portion of the cover insulating layer 13 that is not subjected to the etching. The thickness of the portion of the cover insulating layer 13 above the region R1 of the base insulating layer 11 is preferably not less than 1 μm and not more than 1000 μm, and more preferably not less than 2 μm and not more than 50 μm.

The thickness of the portion of the cover insulating layer 13 above the region R1 of the base insulating layer 11 may be decreased by a tone exposure technique or laser machining instead of etching.

The thickness of the region R1 of the base insulating layer 11 may be decreased instead of decreasing the thickness of the portion of the cover insulating layer 13 above the region R1 of the base insulating layer 11.

The hole 14 that reaches the upper surface of the electrode pad 30 is subsequently formed in the portion of the cover insulating layer 13 above the electrode pad 30 of each wiring trace 20 by etching or laser machining, for example, as shown in FIG. 5 (e).

Then, the plating layer 30a made of gold, for example, is formed by electrolytic plating to fill the hole 14 as shown in FIG. 6. In this case, power is fed for the electrolytic plating through the lead wires S for plating. After the plating layer 30a is formed, the support substrate 50, the base insulating layer 11, the lead wires S for plating and the cover insulating layer 13 are cut off at the one-dot and dash line Z1. In this manner, the suspension board 1 having the suspension body 10 is completed.

(1-3) Bonding of the Suspension Board and the FPC Board

The plurality of electrode pads 30 of the suspension board 1 are bonded to terminals of another printed circuit board (a flexible printed circuit board, for example). Hereinafter, description is made of an example of bonding the electrode pads 30 of the suspension board 1 and the terminals of the flexible printed circuit board (hereinafter referred to as the FPC board).

Figure 7:
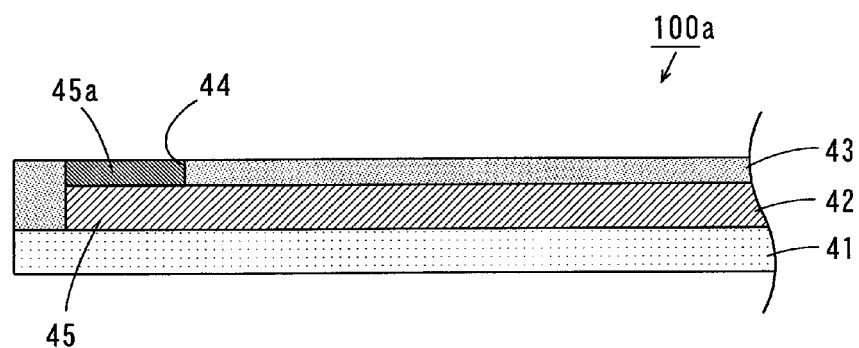
FIG. 7 is a schematic sectional view of an FPC board.
Figure 8:
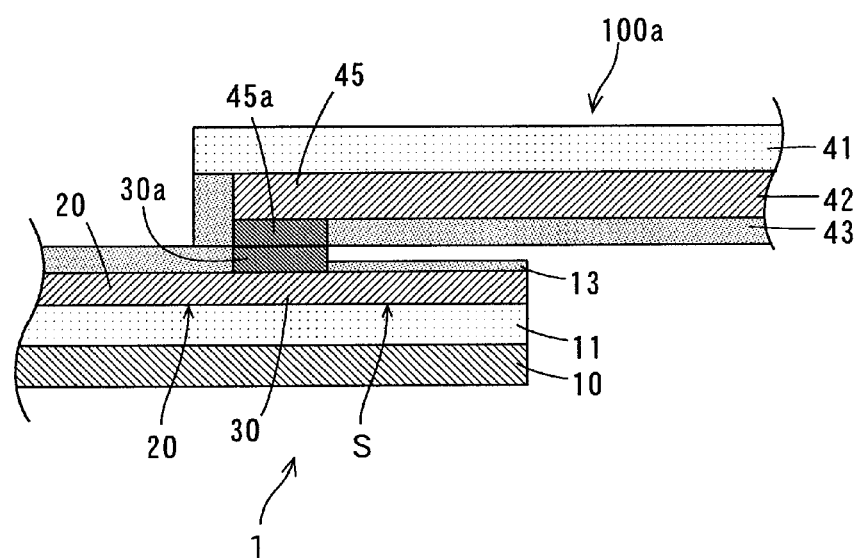
FIG. 8 is a schematic sectional view showing a connection state between an electrode pad of the suspension board and a terminal of the FPC board.

FIG. 7 is a schematic sectional view of the FPC board, and FIG. 8 is a schematic sectional view showing a connection state between the electrode pad 30 of the suspension board 1 and the terminal of the FPC board. In FIG. 8, the FPC board of FIG. 7 is turned upside down.

As shown in FIG. 7, the FPC board 100a includes a base insulating layer 41 made of polyimide, for example. A plurality of wiring traces 42 made of copper, for example, are formed on the base insulating layer 41. FIGS. 7 and 8 show only one of the wiring traces 42.

A terminal 45 is formed at an end of each wiring trace 42. A cover insulating layer 43 made of polyimide, for example, is formed on the base insulating layer 41 to cover the plurality of wiring traces 42. A hole 44 is formed in a portion of the cover insulating layer 43 above the terminal 45 of each wiring trace 42. A plating layer 45a made of gold, for example, is formed to fill each hole 44.

As shown in FIG. 8, the suspension board 1 and the FPC board 100a are arranged such that the electrode pad 30 of the suspension board 1 and the terminal 45 of the FPC board 100a are in contact with each other, and the electrode pad 30 and the terminal 45 (the plating layer 45a) are bonded to each other using ultrasonic waves or a solder, for example.

(1-4) Attenuation of Frequency Component Caused by the Lead Wires S for Plating

Here, description is made of attenuation of a frequency component caused by the lead wires S for plating at the time of transmission of an electrical signal between the suspension board 1 and the FPC board 100a.

When the electrical signal is transmitted through the wiring traces 20 of the suspension board 1 and the wiring traces 42 of the FPC board 100a, the wiring traces 20 and the wiring traces 42 become transmission paths, and the lead wires S for plating become stubs that are branched from the transmission paths.

In this case, resonance occurs at a particular frequency in the stubs. This causes a component of a resonance frequency of the electrical signal transmitted through the transmission paths to be attenuated.

A digital signal includes a plurality of frequency components. If the frequency of the digital signal composed of rectangular waves is defined as f, the digital signal includes a plurality of frequency components that are an integral multiple of the frequency f. Therefore, when the particular frequency component included in the digital signal is attenuated, a waveform of the digital signal becomes blunt, and inclinations of a rising edge and a falling edge become moderate.

Here, differences in transmission of the electrical signal because of the presence/absence of the lead wires S for plating when the electrical signal is transmitted through the wiring traces 20 of the suspension board 1 and the wiring traces 42 of the FPC board 100a were obtained by simulation.

FIG. 9 is a diagram showing simulation results of transmission characteristics of the electrical signal in the case of the presence and absence of the lead wires S for plating.

The ordinate represents an amount of attenuation in a differential mode input and a differential mode output (Sdd21), and the abscissa represents the frequency.

In FIG. 9, the transmission characteristics of the electrical signal when the lead wires S for plating are formed in the suspension board 1 is indicated by the solid line, and the transmission characteristics of the electrical signal when the lead wires S for plating are not formed is indicated by the dotted line.

As shown in FIG. 9, attenuation hardly occurs in all frequency regions when the lead wires S for plating are not formed. On the other hand, significant attenuation occurs in a particular frequency region (a resonance frequency region) when the lead wires S for plating are formed.

Here, assuming that L and λ represent the length of the lead wire S for plating and a wavelength, respectively, the resonance occurs at a frequency that satisfies L=λ/4. Assuming that $f_r$ and v represent the resonance frequency and a transmission speed of the electrical signal, respectively, the resonance frequency $f_r$ caused by the lead wires S for plating is given by the following equation (1):

$$f_r = v/(4L) \tag{1}$$

Assuming that $\epsilon_r$ represents an effective dielectric constant of the periphery of the lead wires S for plating, the transmission speed v of the electrical signal is given by the following equation (2). Here, a value of the effective dielectric constant $\epsilon_r$ is obtained by combining the dielectric constants of elements (including the base insulating layer 11, the cover insulating layer 13 and the atmosphere, for example) in the periphery of the lead wires S for plating.

$$v = 3 \times 10^8 / (\sqrt{\epsilon_r}) \tag{2}$$

The following equation (3) is derived from the equations (1) and (2).

$$f_r = 3 \times 10^8 / (4L\sqrt{\epsilon_r}) \tag{3}$$

As can be understood from the equation (3), the resonance frequency $f_r$ of the electrical signal in the lead wires S for plating can be increased by decreasing the effective dielectric constant $\epsilon_r$. This allows the resonance frequency $f_r$ of the lead wires S for plating to be set to such a value that gives small effects on the waveform of the electrical signal.

(1-5) Effects of the First Embodiment

In the suspension board 1 according to the present embodiment, the thickness of the portion of the cover insulating layer 13 above the region R1 of the base insulating layer 11 in which the plurality of lead wires S for plating are formed is set smaller than the thickness of the cover insulating layer 13 above the other regions of the base insulating layer 11. Accordingly, the effective dielectric constant $\epsilon_r$ of the periphery of the plurality of lead wires S for plating is decreased, and the resonance frequency of the electrical signal in the lead wires S for plating is increased. This allows reduced effects of the resonance in the lead wires S for plating to be exerted on the waveform of the electrical signal. This results in suppression of a blunt waveform of the electrical signal to be caused by the resonance in the lead wires S for plating.

(2) Second Embodiment

Description will be made of a suspension board according to a second embodiment of the present invention while referring to differences from the first embodiment.

Figure 10:
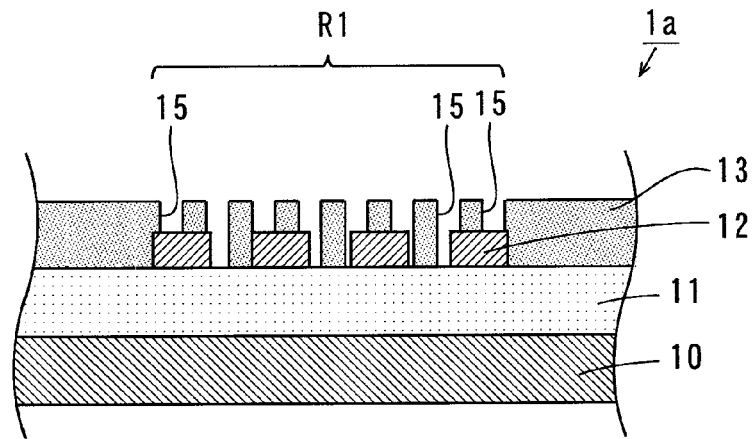
FIG. 10 is a sectional view of a suspension board according to a second embodiment.

FIG. 10 is a sectional view of the suspension board 1a according to the second embodiment. As shown in FIG. 10, a plurality of openings 15 are formed in the portion of the cover insulating layer 13 above the region R1 of the base insulating layer 11 instead of setting the thickness of the portion of the cover insulating layer 13 above the region R1 of the base insulating layer 11 smaller than the thickness of the cover insulating layer 13 above the other regions of the base insulating layer 11 in the suspension board 1a according to the second embodiment. For example, a plurality of openings 15 may be formed to form a mesh-like pattern, or a plurality of slit-like openings 15 may be formed.

Here, the region R1 of the base insulating layer 11 means the region of a portion on the base insulating layer 11 on which the lead wires S for plating are formed.

In the manufacture of the suspension board 1a, the plurality of openings 15 are formed in the cover insulating layer 13 by etching, for example, after the step shown in (c) of FIGS. 4 and 5 of the first embodiment. The plurality of openings 15 may be formed in the cover insulating layer 13 using a photolithography technique or lasers. The sum of areas of portions of the openings 15 overlapping the lead wires S for plating is preferably not less than 30%, and more preferably not less than 50% of the area of a portion of the base insulating layer 11 in contact with the lead wires S for plating.

Also in this case, the effective dielectric constant $\epsilon_r$ of the periphery of the plurality of lead wires S for plating is decreased, and the resonance frequency of the electrical signal in the lead wires S for plating is increased, similarly to the foregoing first embodiment. This allows reduced effects of the resonance in the lead wires S for plating to be exerted on the waveform of the electrical signal. This results in suppression of a blunt waveform of the electrical signal to be caused by the resonance in the lead wires S for plating.

The plurality of openings 15 may be formed in the region R1 of the base insulating layer 11.

(3) Third Embodiment

Description will be made of a suspension board 1b according to a third embodiment of the present invention while referring to differences from the first embodiment.

Figure 11:
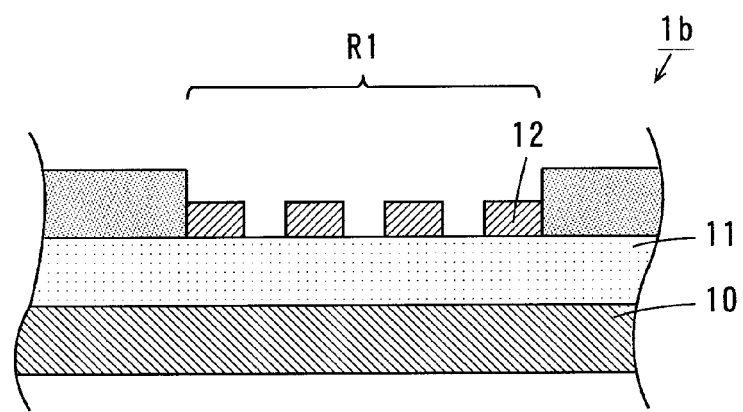
FIG. 11 is a sectional view of a suspension board according to a third embodiment.

FIG. 11 is a sectional view of the suspension board 1b according to the third embodiment. As shown in FIG. 11, the cover insulating layer 13 is not formed above the region R1 of the base insulating layer 11 in the suspension board 1b according to the third embodiment.

In the manufacture of the suspension board 1b, the portion of the cover insulating layer 13 above the region R1 of the base insulating layer 11 is removed by etching, for example, after the step shown in (c) of FIGS. 4 and 5 of the first embodiment.

In this case, the effective dielectric constant $\epsilon_r$ of the periphery of the plurality of lead wires S for plating is further decreased and the resonance frequency of the electrical signal in the lead wires S for plating is further increased as compared with those in the first and second embodiments. This allows further reduced effects of the resonance in the lead wires S for plating to be exerted on the waveform of the electrical signal. This results in sufficient suppression of a blunt waveform of the electrical signal to be caused by the resonance in the lead wires S for plating.

The region R1 of the base insulating layer 11 may be removed instead of removing the portion of the cover insulating layer 13.

(4) Fourth Embodiment

Description will be made of a suspension board 1c according to a fourth embodiment of the present invention while referring to differences from the second embodiment.

Figure 12:
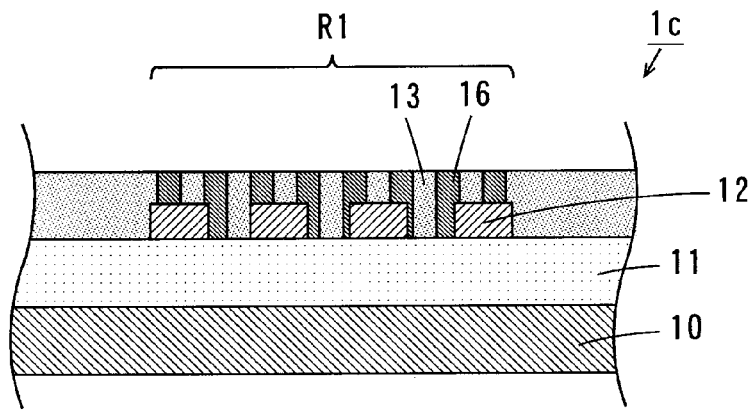
FIG. 12 is a sectional view of a suspension board according to a fourth embodiment.

FIG. 12 is a sectional view of the suspension board 1c according to the fourth embodiment. As shown in FIG. 12, a dielectric 16 having a lower dielectric constant than that of the cover insulating layer 13 is filled in the openings 15 of the cover insulating layer 13 in the suspension board 1c according to the fourth embodiment. Examples of the dielectric 16 include a porous dielectric material (polyimide, for example) having a plurality of pores.

In this case, the effective dielectric constant $\epsilon_r$ of the periphery of the plurality of lead wires S for plating is decreased, and the resonance frequency of the electrical signal in the lead wires S for plating is increased. This allows reduced effects of the resonance in the lead wires S for plating to be exerted on the waveform of the electrical signal. This results in suppression of a blunt waveform of the electrical signal to be caused by the resonance in the lead wires S for plating. The lead wires S for plating are not exposed, thus preventing corrosion of the lead wires S for plating.

The dielectric 16 may be filled in the openings 15 after the openings 15 are formed in the base insulating layer 11.

(5) Other Embodiments

The configurations of the first to fourth embodiments may be combined. For example, the thickness of the portion of the cover insulating layer 13 above the region R1 of the base insulating layer 11 in which the plurality of lead wires S for plating are formed may be set smaller than the thickness of the portion of the cover insulating layer 13 above the other regions of the base insulating layer 11, and the plurality of openings 15 may be formed in the portion of the cover insulating layer 13 above the region R1 of the base insulating layer 11. The dielectric 16 having the lower dielectric constant than that of the cover insulating layer 13 may be filled in the openings 15.

The thickness of the portion of the cover insulating layer 13 above the region R1 of the base insulating layer 11 may be set smaller than the thickness of the portion of the cover insulating layer 13 above the other regions of the base insulating layer 11, and the plurality of openings 15 may be formed in the region R1 of the base insulating layer 11. The dielectric 16 having the lower dielectric constant than that of the base insulating layer 11 may be filled in the openings 15.

The thickness of the portion of the cover insulating layer 13 above the region R1 of the base insulating layer 11 may be set smaller than the thickness of the portion of the cover insulating layer 13 above the other regions of the base insulating layer 11, and the region R1 of the base insulating layer 11 may be removed.

The thickness of the region R1 of the base insulating layer 11 may be set smaller than the thickness of the other regions of the base insulating layer 11, and the plurality of openings 15 may be formed in the portion of the cover insulting layer 13 above the region R1 of the base insulating layer 11. The dielectric 16 having the lower dielectric constant than that of the cover insulating layer 13 may be filled in the openings 15.

The thickness of the region R1 of the base insulating layer 11 may be set smaller than the thickness of the other regions of the base insulating layer 11, and the portion of the cover insulating layer 13 above the region R1 of the base insulating layer may be removed.

(6) Inventive Example and Comparative Example (6-1) Inventive Example

The suspension board 1 of the first embodiment was prepared in the following conditions.

Stainless steel was used as the material for the suspension body 10 (the support substrate 50), polyimide was used as the material for the insulating layer 11, copper was used as the material for the wiring traces 20 and the lead wires S for plating, polyimide was used as the material for the cover insulating layer 13, and gold was used as the material for the plating layer 30a.

The thickness of the suspension body 10 (the support substrate 50) was 18 µm, the thickness of the base insulating layer 11 was 10 µm, the thickness of each of the wiring traces 20 and the lead wires S for plating was 12 µm, the width of each of the wiring traces 20 and the lead wires S for plating was 35 µm, and the length of the lead wire S for plating was 9 µm.

The thickness of the portion of the cover insulating layer 13 above the region R1 of the base insulating layer 11 was 3 µm, and the thickness of the portion of the cover insulating layer 13 above the other regions of the base insulating layer 11 was 6 µm.

(6-2) Comparative Example

The suspension board 1 was formed in the same manner as the foregoing inventive example except that the thickness of the cover insulating layer 13 was uniformly set to 6 µm.

(6-3) Evaluation

As shown in FIG. 8, the electrode pad 30 of each of the suspension boards 1 of the inventive example and the comparative example was bonded to the terminal 45 of the FPC board 100a, and the electrical signal was transmitted from the wiring trace 20 of the suspension board 1 to the wiring trace 42 of the FPC board 100a.

A blunt waveform of the electrical signal hardly occurred in the inventive example. On the other hand, a blunt waveform of the electrical signal occurred in the comparative example.

The portion of the cover insulating layer 13 above the region R1 of the base insulating layer 11 was formed such that the thickness thereof is smaller than the thickness of the portion of the cover insulating layer 13 above the other regions of the base insulating layer 11, thereby causing reduced effects of the resonance in the lead wires S for plating to be exerted on the waveform of the electrical signal. This results in suppression of a blunt waveform of the electrical signal to be caused by the resonance in the lead wires S for plating.

(7) Correspondences between Elements in the Claims and Parts in Embodiments

In the following paragraph, non-limiting examples of correspondences between various elements recited in the claims below and those described above with respect to various preferred embodiments of the present invention are explained.

In the foregoing embodiments, the base insulating layer 11 is an example of a first insulating layer, the wiring trace 20 is an example of a wiring trace, the electrode pad 30 is an example of a terminal, the lead wire S for plating is an example of a lead for plating, the cover insulating layer 13 is an example of a second insulating layer, the suspension board 1 is an example of a printed circuit board, and the opening 15 is an example of an opening.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A printed circuit board comprising:
   a first insulating layer;
   a wiring trace formed on said first insulating layer;
   a terminal provided at a first portion of said wiring trace;
   a lead for plating formed on said first insulating layer to extend from said wiring trace; and
   a second insulating layer formed on said first insulating layer to cover said wiring trace and said lead for plating, wherein
   said second insulating layer has a first opening therein to expose the terminal of said wiring trace,
   at least one of said first and second insulating layers includes a first portion overlapping a second portion of said wiring trace and a second portion overlapping a portion of said lead for plating, neither the second portion of said wiring trace nor the portion of said lead for plating overlapping said first opening, and
   a thickness of said second portion of said first or second insulating layer is set smaller than a thickness of said first portion of said first or second insulating layer such that an effective dielectric constant of a region overlapping said lead for plating is set smaller than an effective dielectric constant of a region overlapping said wiring trace.

2. The printed circuit board according to claim 1, wherein a second opening is formed in said second portion of the at least one of said first and second insulating layers.

3. The printed circuit board according to claim 2, wherein a material having a lower dielectric constant than a dielectric constant of said first or second insulating layer is filled in said second opening.

4. The printed circuit board according to claim 1, wherein at least one of said first and second insulating layers is formed such that said lead for plating is exposed.

5. A method of manufacturing a printed circuit board, comprising the steps of:
   forming a conductor pattern including a wiring trace, a terminal provided at a first portion of said wiring trace, and a lead for plating extending from said wiring trace on a first insulating layer;
   forming a second insulating layer on said first insulating layer to cover said wiring trace and said lead for plating;
   forming a first opening in said second insulating layer to expose the terminal of said wiring trace;

forming a first terminal coated with a plating layer at the portion of said wiring trace by feeding power to said wiring trace through said lead for plating; and setting an effective dielectric constant of a region overlapping said lead for plating smaller than an effective dielectric constant of a region overlapping said wiring trace, wherein at least one of said first and second insulating includes a first portion overlapping a second portion of said wiring trace and a second portion overlapping a portion of said lead for plating, neither the second portion of said wiring trace nor the portion of said lead for plating overlapping said first opening, and said step of setting the effective dielectric constant smaller includes setting a thickness of said second portion of said first or second insulating layer smaller than a thickness of said first portion of said first or second insulating layer.

6. The method of manufacturing the printed circuit board according to claim 5, wherein said step of setting the effective dielectric constant smaller includes the step of forming a second opening in said second portion of the at least one of first and second insulating layers.

7. The method of manufacturing the printed circuit board according to claim 6, wherein said step of setting the effective dielectric constant smaller further includes the step of filling a material having a lower dielectric constant than a dielectric constant of said first or second insulating layer in said second opening.

8. The method of manufacturing the printed circuit board according to claim 5, wherein said step of setting the effective dielectric constant smaller includes the step of forming at least one of said first and second insulating layers such that said lead for plating is exposed.

9. A printed circuit board comprising:
a first insulating layer;
a wiring trace formed on said first insulating layer;
a terminal provided at a portion of said wiring trace;
a lead for plating formed on said first insulating layer to extend from said wiring trace; and a second insulating layer formed on said first insulating layer to cover said wiring trace excluding said terminal and to cover said lead for plating, wherein at least one of said first and second insulating layers includes a first portion overlapping said wiring trace and a second portion overlapping said lead for plating, and a thickness of said second portion is set smaller than a thickness of said first portion such that an effective dielectric constant of a region overlapping said lead for plating is set smaller than an effective dielectric constant of a region overlapping said wiring trace, such that any unwanted resonance in said lead for plating is prevented and any distortion of a waveform of an electrical signal is prevented.

10. A method of manufacturing a printed circuit board, comprising the steps of:

forming a conductor pattern including a wiring trace, a terminal provided at a portion of said wiring trace, and a lead for plating extending from said wiring trace on a first insulating layer;

forming a second insulating layer on said first insulating layer to cover said wiring trace excluding said terminal and to cover said lead for plating;

forming the terminal coated with a plating layer at the portion of said wiring trace by feeding power to said wiring trace through said lead for plating; and setting an effective dielectric constant of a region overlapping said lead for plating smaller than an effective dielectric constant of a region overlapping said wiring trace, wherein at least one of said first and second insulating layers includes a first portion overlapping said wiring trace and a second portion overlapping said lead for plating, and said step of setting the effective dielectric constant smaller includes setting a thickness of said second portion smaller than a thickness of said first portion, such that any unwanted resonance in said lead for plating is prevented and any distortion of a waveform of an electrical signal is prevented.

* * * * *